United States Patent [19]
Chi et al.

[11] Patent Number: 5,608,243
[45] Date of Patent: Mar. 4, 1997

[54] SINGLE SPLIT-GATE MOS TRANSISTOR ACTIVE PIXEL SENSOR CELL WITH AUTOMATIC ANTI-BLOOMING AND WIDE DYNAMIC RANGE

[75] Inventors: Min-Hwa Chi; Albert Bergemont, both of Palo Alto, Calif.

[73] Assignee: National Semiconductor Corporation, Santa Clara, Calif.

[21] Appl. No.: 545,040

[22] Filed: Oct. 19, 1995

[51] Int. Cl.$^6$ .................... H01L 27/148; H01L 31/062
[52] U.S. Cl. .................... 257/249; 257/250; 257/292; 257/317; 257/320; 257/462
[58] Field of Search .................... 257/223, 233, 257/236, 249, 250, 257, 258, 290, 291, 292, 294, 317, 320, 445, 448, 462; 377/60

[56] References Cited

U.S. PATENT DOCUMENTS

| | | | |
|---|---|---|---|
| 5,191,398 | 3/1993 | Mutoh | 257/216 |
| 5,289,023 | 2/1994 | Mead | 257/291 |

FOREIGN PATENT DOCUMENTS

| | | | |
|---|---|---|---|
| 4-145663 | 5/1992 | Japan | 257/291 |

OTHER PUBLICATIONS

Yadid-Pecht, O. et al., "A Random Access Photodiode Array for Intelligent Image Capture", *IEEE Transactions of Electron Devices*, vol. 38, No. 8, Aug. 1991.

Fossum, Eric R., "Active-Pixel Sensors Challenge CCDs", *Laser Focus World*, Jun. 1993, pp. 83–87.

Dickinson, A. et al., "TP 13.5: A 256×256 CMOS Active Pixel Image Sensor with Motion Detection," ISSCC95/ Session 13/Image Sensors and Systems/Paper TP 13.5, 1995, IEEE International Solid-State Circuits Conference, pp. 226–227.

*Primary Examiner*—Minhloan Tran
*Attorney, Agent, or Firm*—Limbach & Limbach L.L.P.

[57] ABSTRACT

The size of an active pixel sensor cell is reduced by utilizing a single split-gate MOS transistor and a reset gate. The split-gate transistor includes an image collection region which is formed in the drain region and electrically connected to the floating gate of the transistor. Light energy striking the image collection region varies the potential of the floating gate which, in turn, varies the threshold voltage of the transistor. As a result, the current sourced by the transistor is proportional to the received light energy.

9 Claims, 2 Drawing Sheets

5,608,243

SINGLE SPLIT-GATE MOS TRANSISTOR ACTIVE PIXEL SENSOR CELL WITH AUTOMATIC ANTI-BLOOMING AND WIDE DYNAMIC RANGE

BACKGROUND OF THE INVENTION

1. Field of the Invention

The present invention relates to active pixel sensor cells and, more particularly, to a single split-gate MOS transistor active pixel sensor cell that provides automatic anti-blooming and wide dynamic range.

2. Description of the Related Art

Conventional imaging circuits rely on charge-coupled devices (CCDs) to convert a pixel of light energy into an electrical signal that represents the intensity of the light energy. In general, CCDs utilize a photogate to collect the light energy, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photogate is typically combined with a number of active transistors which, in addition to forming an electrical signal, provide amplification, readout control, and reset control.

FIG. 1 shows an example of a conventional CMOS active pixel sensor cell 10. As shown in FIG. 1, cell 10 includes a photogate PG, a reset transistor RT, and a transfer gate TX formed between the source of reset transistor RT and photogate PG. In addition, active pixel sensor cell 10 also includes a sense transistor ST, whose gate is connected to the source of reset transistor RT, and an access transistor AT.

Operation of active pixel sensor cell 10 is performed in two steps; image integration, where the light energy is collected by photogate PG, and signal readout, where the collected energy is converted into an electrical signal and read out.

During image integration, a positive voltage (5 volts) is applied to the photogate PG, while a smaller positive voltage (2.5 volts) is applied to the transfer gate TX. Under these conditions, light energy, in the form of photons, strikes the substrate under photogate PG which, in turn, creates a number of electron-hole pairs. Due to the positive voltage applied to photogate PG, the photogenerated electrons are collected under the photogate PG.

At the same time, a positive voltage (2.5 volts) is applied to the gate of reset transistor RT to control anti-blooming by allowing excess charge to flow to the drain of reset transistor RT. In addition, access transistor AT is turned off.

Following image integration, active pixel sensor cell 10 is read out by first enabling access transistor AT. Next, the source of reset transistor RT is reset by briefly pulsing the gate of reset transistor RT with a positive voltage (5 volts). This resets the source of reset transistor RT to an initial voltage (approximately 3.5 volts).

Following this, photogate PG is pulsed low (0 volts) to transfer the signal charge stored under photogate PG to the source of reset transistor RT which, in turn, modulates the current flowing through sense transistor ST.

One of the principal advantages of active pixel sensor cell 10, in addition to providing amplification and reduced size, is that the fabrication process is inherently CMOS since only MOS transistors are utilized. However, although cell 10 is smaller than conventional CCDs, there is still a need to further reduce the size of active pixel sensor cells.

SUMMARY OF THE INVENTION

Conventionally, the size of an active pixel sensor cell is defined in part by the space requirements of the photogate or photodiode used to collect light energy, the sense transistor used to convert the collected light energy into an electrical signal, and the access transistor used to control the output of the signal. The present invention, however, substantially reduces the size of an active pixel sensor cell by integrating each of these functions into a single split-gate MOS transistor.

In the present invention, an active pixel sensor cell includes a pixel transistor and a reset gate. The pixel transistor includes spaced-apart source and drain regions which are formed in a semiconductor substrate. The source and drain regions, in turn, define a channel region within the substrate. In addition, the pixel transistor also includes an image collection region, which is formed in the drain region, a first conductive gate, and a second conductive gate. The first conductive gate is formed over a first portion of the channel region and a portion of the drain region, and is separated therefrom by a first layer of dielectric material. In accordance with the present invention, the first conductive gate is electrically connected to the image collection region. The second conductive gate is formed over a second portion of the channel region and a portion of the first conductive gate. The portion of the second conductive gate which is formed over the second portion of the channel region is separated from the channel region by a second layer of dielectric material. The portion of the second conductive gate which is formed over the first conductive gate is separated from the second conductive gate by a third layer of dielectric material. The reset gate, in turn, is formed over a portion of the drain region that adjoins the image region and the substrate. In addition, the reset gate is separated from the drain region by a fourth layer of dielectric material.

In operation, photons striking the image collection region increase the potential of the image collection region which, in turn, increases the potential of the floating gate. As the potential of the floating gate increases, the threshold voltage of the pixel transistor decreases. As a result, the current sourced by the transistor when a read voltage is applied to the control gate is proportional to the received light energy.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
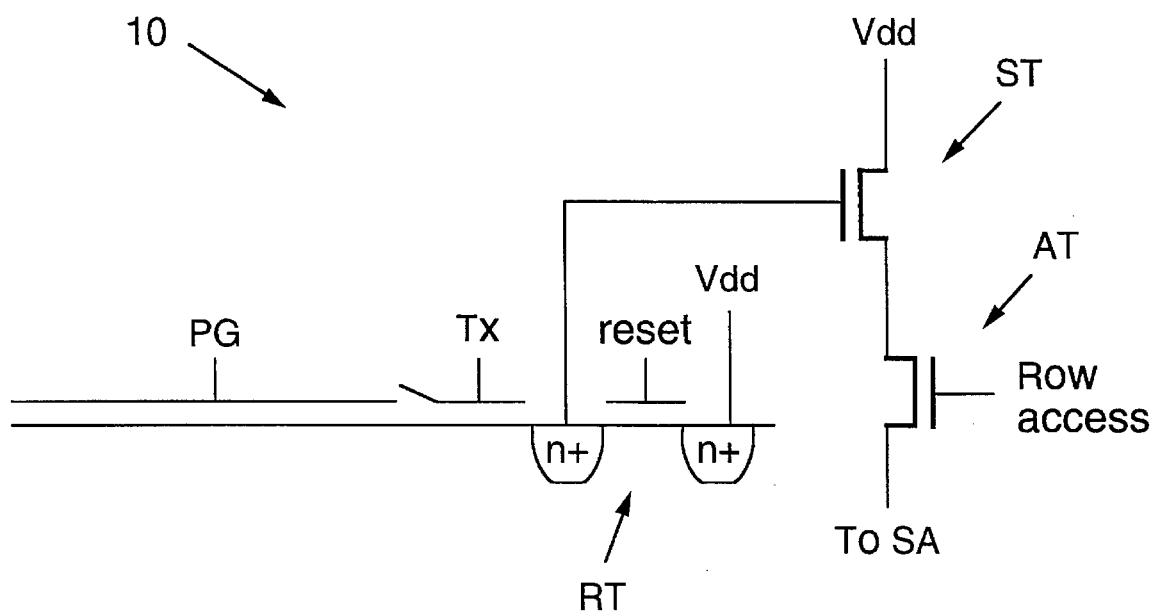
FIG. 1 is a cross-sectional diagram illustrating a conventional active pixel sensor cell 10.
Figure 2A:
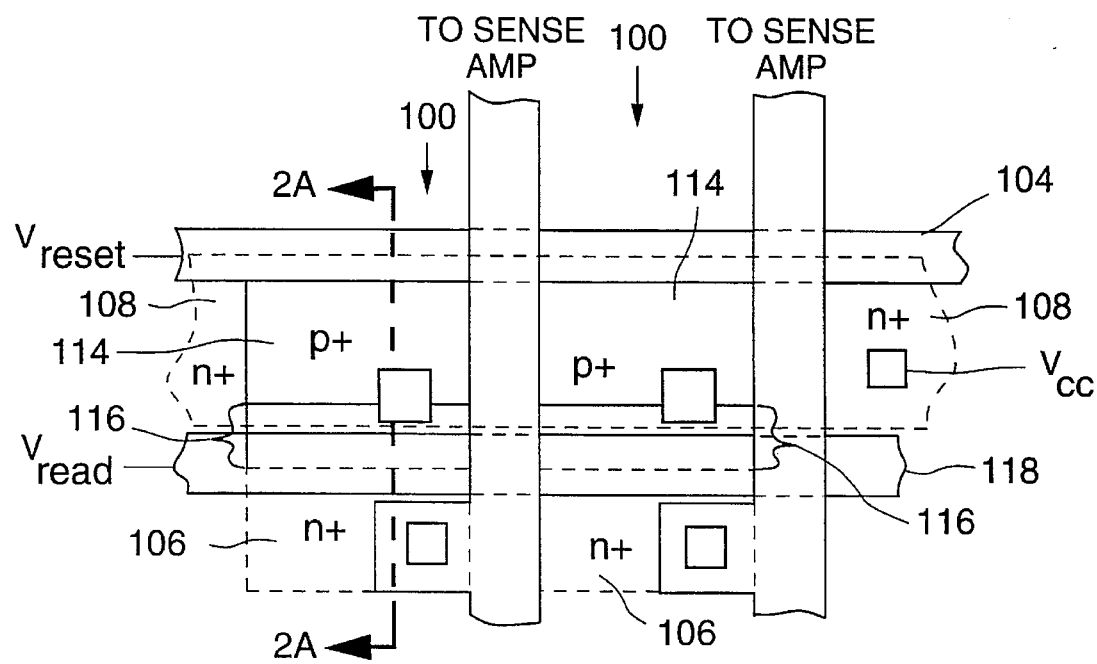
FIG. 2A is a plan view illustrating a pair of active pixel sensor cells 100 in accordance with the present invention.
Figure 2B:
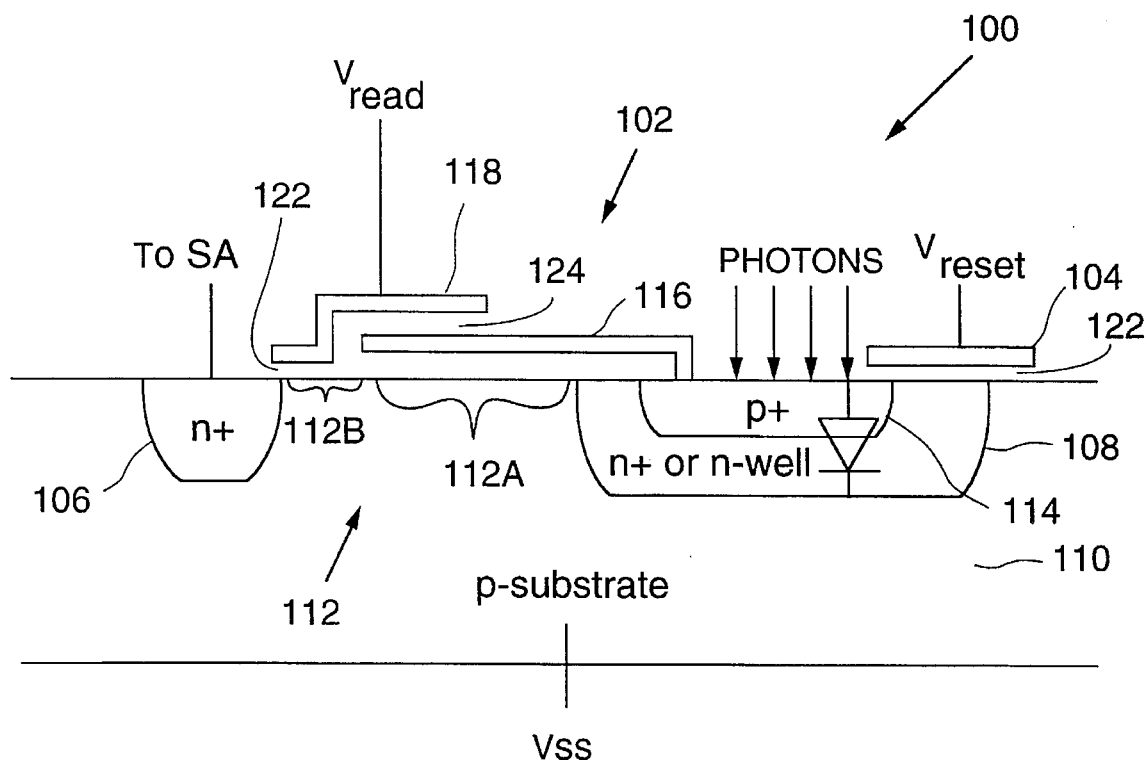
FIG. 2B is a cross-sectional diagram taken along lines 2A—2A of FIG. 2A.

FIG. 2A shows a plan view of a pair of active pixel sensor cells 100 in accordance with the present invention. FIG. 2B shows a cross-sectional diagram taken along line 2A—2A of FIG. 2A.

As shown in FIGS. 2A and 2B, each cell 100 includes a split-gate pixel transistor 102 and a reset gate 104. Split-gate pixel transistor 102, which outputs the image information for a single pixel, includes spaced-apart source and drain regions 106 and 108, respectively, which are formed in a p-type semiconductor substrate 110. Source and drain regions 106 and 108, in turn, define a channel region 112 within substrate 110.

In addition, transistor 102 also includes a p+region 114, which is formed in drain region 108, a floating gate 116, and a control gate 118. Floating gate 116, which is electrically connected to p+region 114, is formed over a first portion 112A of channel region 112 and a portion of drain region 108, and is isolated from channel region 112 and drain region 108 by a layer of dielectric material 122.

Control gate 118, in turn, is formed over a second portion 112B of channel region 112 and a portion of floating gate 116, and is isolated from channel region 112 by dielectric layer 122 and from floating gate 116 by a second layer of dielectric material 124.

As further shown in FIGS. 2A and 2B, reset gate 104 is formed over a portion of drain region 108 that adjoins substrate 110 and p+region 114. In addition, reset gate 104 is isolated from drain region 108 by dielectric layer 122.

In operation, prior to image integration, the voltage on p+region 114 and floating gate 116 is reset to be substantially equal to the bias voltage applied to substrate 110. In accordance with the present invention, the voltage on p+region 114 and floating gate 116 is reset to the substrate voltage by taking advantage of the p-channel parasitic transistor that is formed between p-type substrate 110 and p+region 114.

Thus, when ground Vss is applied to substrate 110 and control gate 118, a positive bias voltage Vcc is applied to drain region 108, and a negative reset voltage Vreset is applied to reset gate 104, holes from drain region 108 are attracted to the top surface of drain region 108 which, in turn, form a conductive channel between p+region 114 and substrate 110. As a result, the voltage on p+region 114 and floating gate 116 will drop to a value which is approximately equal to ground Vss.

After the voltage on p+region 114 and floating gate 116 has been lowered to the substrate voltage, p+region 114 and floating gate 116 are floated by changing the negative reset voltage Vreset to a positive voltage, e.g. Vcc, which, in turn, eliminates the conductive channel induced in drain region 108. Thus, the junction between p+region 114 and drain region 108, which forms a photo-diode for collecting image charges, is initially reverse-biased by lowering the voltage on p+region 114 with respect to the voltage on drain region 108 (which is connected to the positive bias voltage Vcc).

Once the voltage on p+region 114 and floating gate 116 has been reset, the next step is to begin image integration. During image integration, photons strike the surface of p+region 114 and, as a result, create a number of electron-hole pairs. The number of created electron-hole pairs is a function of the intensity of the received light energy.

The photogenerated electrons, in turn, are swept to the drain region 108 due to the built-in electrical field in the junction. This loss of electrons, in turn, raises the potential of p+region 114 and floating gate 116. Similarly, some of the photogenerated holes, which are formed by photons, are swept into the p+region 114, thereby further increasing the potential of p+region 114 and floating gate 116.

As the potential of floating gate 116 rises, the threshold voltage of split-gate pixel transistor 102 falls. As a result, the magnitude of the threshold voltage is proportional to the number of photons which have struck p+region 114 from the beginning of the integration period to the end of the integration period.

After the integration period has ended, each active pixel cell 100 is read by applying a positive read voltage Vread to control gate 118. The read voltage Vread applied to control gate 118 induces the formation of a conductive channel on the top surface of the channel region 112 of substrate 110. The conductive channel, in turn, allows a current to flow from the drain region 108 to the source region 106 (the electrons flow from source region 106 to drain region 108).

Due to the capacitive coupling between the control gate 118 and the floating gate 116, the potential on floating gate 116 modulates the magnitude of the current. Thus, in accordance with the present invention, as more and more photons strike p+region 114 during the integration period, the potential of floating gate 116 rises which, in turn, increases the magnitude of the current flowing from the drain region 108 to the source region 106 when the read voltage Vread is applied.

For example, when the source region 106 is grounded, a positive voltage Vcc is applied to the drain region 108, and a read voltage Vread of approximately Vcc is applied to control gate 118, the current output from pixel transistor 102 will have one magnitude in low light conditions, and a much larger magnitude in bright light.

In addition, when p+region 114 is exposed to very bright light, the present invention automatically provides anti-blooming control, which limits the maximum potential that p+region 114 can reach, when p+region 114 becomes forward-biased with respect to drain region 108.

Since the positive voltage Vcc is applied to the drain region 108, p+region 114 will become forward-biased when the potential of p+region 114 is approximately 0.7 volts greater than voltage Vcc. As a result, the dynamic range of the active pixel sensor cells 100 ranges from zero volts to approximately Vcc+0.7 volts. In addition, the cells 100 can be designed to operate with a low Vcc, e.g., 2.5 or 3.3 volts. Thus, the present invention provides a wide dynamic range that is adjustable.

One advantage of the present invention is that the capacitive coupling between the control gate 118 and the floating gate 116 can be varied by varying the extent to which the control gate 118 overlaps the floating gate 116. By varying the capacitive coupling, the point at which pixel transistor 102 begins to conduct can also be varied.

Thus, to insure that the lower end of dynamic range is available, the capacitive coupling can be varied to insure that pixel transistor 102 will conduct a current even when the potential on floating gate 116 is at the lower end of the dynamic range.

Another advantage provided by the present invention is that by varying the doping level and doping profile of the n-type drain 108, the built-in electric field and depletion layer can be optimized for more efficient collection of holes and electrons and thus, the rising potential of the p+region is more responsive to the received light energy. As a result, the active pixel sensor cells 100 provide the ability to tailor the magnitude of the current output by pixel transistor 102 to the photo intensity of the received light.

Thus, in accordance with the present invention, an active pixel sensor cell has been described which provides a substantially reduced size (only one MOS transistor reduces the size by approximately 3X over other MOS pixel designs), automatic anti-blooming, and a wide dynamic range. In addition, because only MOS compatible structures are utilized, the present invention is easily integratable with standard CMOS fabrication processes.

It should be understood that various alternatives to the embodiment of the invention described herein may be employed in practicing the invention. For example, the same structure with opposite polarity can be easily implemented when the bias voltages are properly reversed.

One advantage of using a p-channel pixel transistor is that current CMOS technology typically provides a surface-channel NMOS device and a buried-channel PMOS device. Since the noise of a surface-channel NMOS device is more severe than a buried-channel PMOS device, a PMOS device provides a lower noise level. This feature is especially important for low light imaging applications.

Thus, it is intended that the following claims define the scope of the invention and that methods and structures within the scope of these claims and their equivalents be covered thereby.

What is claimed is:

1. An active pixel sensor cell formed in a semiconductor substrate of a first conductivity type, the cell comprising:
    a first region of a second conductivity type formed in the substrate;
    a second region of the second conductivity type formed in the substrate, the first and second regions defining a channel region therebetween,
    an image collection region of the first conductivity type formed in the second region,
    a first conductive gate electrically connected to the image collection region, the first conductive gate being formed over a first portion of the channel region and a portion of the second region and separated therefrom by a first layer of dielectric material, and
    a second conductive gate formed over a second portion of the channel region and a portion of the first conductive gate, the second conductive gate formed over a second portion of the channel region being separated therefrom by a second layer of dielectric material, the second conductive gate formed over the first conductive gate being separated therefrom by a third layer of dielectric material; and
    a reset gate formed over a portion of the second region that adjoins the image collection region and the substrate, the reset gate being separated from the second region by a fourth layer of dielectric material, and electrically isolated from the second conductive gate.

2. The cell of claim 1 wherein the junction between the image collection region and the second region forms a photodiode.

3. A method for resetting an active pixel sensor cell formed in substrate of a first conductivity type, the active pixel sensor cell including:
    a first region of a second conductivity type formed in the substrate;
    a second region of the second conductivity type formed in the substrate, the first and second regions defining a channel region therebetween,
    an image collection region of the first conductivity type formed in the second region,
    a first conductive gate electrically connected to the image collection region, the first conductive gate being formed over a first portion of the channel region and a portion of the second region and separated therefrom by a first layer of dielectric material, and
    a second conductive gate formed over a second portion of the channel region and a portion of the first conductive gate, the second conductive gate formed over a second portion of the channel region being separated therefrom by a second layer of dielectric material, the second conductive gate formed over the first conductive gate being separated therefrom by a third layer of dielectric material; and
    a reset gate formed over a portion of the second region that adjoins the image collection region and the substrate, the reset gate being separated from the second region by a fourth layer of dielectric material, and electrically isolated from the second conductive gate,
    the method including the steps of:
        applying zero potential to the substrate and the second conductive gate;
        applying a first voltage to the second region; and
        applying a second voltage to the reset gate.

4. The method of claim 3 wherein the first voltage is positive.

5. The method of claim 4 wherein the second voltage is negative.

6. A method for reading an active pixel sensor cell formed in substrate of a first conductivity type, the active pixel sensor cell including:
    a first region of a second conductivity type formed in the substrate;
    a second region of the second conductivity type formed in the substrate, the first and second regions defining a channel region therebetween,
    an image collection region of the first conductivity type formed in the second region,
    a first conductive gate electrically connected to the image collection region, the first conductive gates being formed over a first portion of the channel region and a portion of the second region and separated therefrom by a first layer of dielectric material, and
    a second conductive gate formed over a second portion of the channel region and a portion of the first conductive gate, the second conductive gate formed over a second portion of the channel region being separated therefrom by a second layer of dielectric material, the second conductive gate formed over the first conductive gate being separated therefrom by a third layer of dielectric material; and
    a reset gate formed over a portion of the second region that adjoins the image collection region and the substrate, the reset gate being separated from the second region by a fourth layer of dielectric material, and electrically isolated from the second conductive gate,
    the method including the steps of:
        exposing the sensor cell to photons for a predetermined period of time, the photons causing a voltage on the image collection region and the first conductive gate to change; and
        applying a voltage to the second conductive gate,
        wherein the voltage on the first conductive gate and the voltage on the second conductive gate cause a current to flow from the second region to the first region.

7. The method of claim 6 wherein a magnitude of the current is proportional to the voltage on the first conductive gate.

8. The method of claim 7 wherein the photons cause the voltage on the first conductive gate to rise.

9. The method of claim 8 wherein the voltage applied to the second conductive gate is positive.

* * * * *

UNITED STATES PATENT AND TRADEMARK OFFICE
CERTIFICATE OF CORRECTION

PATENT NO. : 5,608,243
DATED : March 4, 1997
INVENTOR(S) : Min-Hwa Chi et al.

It is certified that error appears in the above-indentified patent and that said Letters Patent is hereby corrected as shown below:

In Col. 6, line 32, delete "gates" and replace with --gate--.

Signed and Sealed this

Twentieth Day of May, 1997

Attest:

BRUCE LEHMAN

Attesting Officer

Commissioner of Patents and Trademarks